US012347839B2

(12) United States Patent
Tan

(10) Patent No.: US 12,347,839 B2
(45) Date of Patent: Jul. 1, 2025

(54) POWER TOOL SYSTEM

(71) Applicant: MILWAUKEE ELECTRIC TOOL CORPORATION, Brookfield, WI (US)

(72) Inventor: Jiannan Tan, Irvine, CA (US)

(73) Assignee: Milwaukee Electric Tool Corporation, Brookfield, WI (US)

(*) Notice: Subject to any disclaimer, the term of this patent is extended or adjusted under 35 U.S.C. 154(b) by 388 days.

(21) Appl. No.: 17/860,809

(22) Filed: Jul. 8, 2022

(65) Prior Publication Data

US 2023/0009134 A1    Jan. 12, 2023

Related U.S. Application Data

(60) Provisional application No. 63/219,408, filed on Jul. 8, 2021.

(51) Int. Cl.
| | |
|---|---|
| *H02J 7/00* | (2006.01) |
| *B25F 5/00* | (2006.01) |
| *H01M 10/613* | (2014.01) |
| *H01M 10/623* | (2014.01) |
| *H01M 10/6563* | (2014.01) |
| *H05K 7/20* | (2006.01) |

(52) U.S. Cl.
CPC ......... *H01M 10/6563* (2015.04); *B25F 5/008* (2013.01); *H01M 10/613* (2015.04); *H01M 10/623* (2015.04); *H02J 7/0042* (2013.01); *H05K 7/20936* (2013.01); *H01M 2220/30* (2013.01)

(58) Field of Classification Search
None
See application file for complete search history.

(56) References Cited

U.S. PATENT DOCUMENTS

| | | | |
|---|---|---|---|
| 3,767,468 | A | 10/1973 | Schusler |
| 6,027,535 | A | 2/2000 | Eberle et al. |
| 6,218,807 | B1 | 4/2001 | Sakaue et al. |
| 6,339,312 | B2 | 1/2002 | Sakaue et al. |
| 6,342,773 | B2 | 1/2002 | Sakaue et al. |
| 6,373,228 | B1 | 4/2002 | Sakakibara |
| 6,455,186 | B1 | 9/2002 | Moores, Jr. et al. |

(Continued)

FOREIGN PATENT DOCUMENTS

| | | |
|---|---|---|
| CN | 201084796 Y | 7/2008 |
| CN | 202888884 U | 4/2013 |

(Continued)

OTHER PUBLICATIONS

US 7,811,699 B2, 10/2010, Sakakibara (withdrawn)
International Search Report and Written Opinion for Application No. PCT/US2022/036526 dated Oct. 28, 2022 (11 pages).

*Primary Examiner* — Arun C Williams
(74) *Attorney, Agent, or Firm* — Michael Best & Friedrich LLP

(57) ABSTRACT

A charger including a housing including a front wall, a rear wall, a top wall, a bottom wall, a first side wall, and a second side wall, an interface configured to engage a battery pack, and an air conditioning assembly coupled within the housing adjacent the interface. The air conditioning system is operable to suck an ambient air flow into the housing from outside the housing, reduce a temperature of the air flow to create a cooling air flow, and guide the cooling air flow to the battery pack interface.

15 Claims, 14 Drawing Sheets

(56) References Cited

U.S. PATENT DOCUMENTS

| | | |
|---|---|---|
| 6,537,694 B1 | 3/2003 | Sugiura et al. |
| 6,566,005 B1 | 5/2003 | Shimma et al. |
| 6,597,572 B2 | 7/2003 | Nishikawa et al. |
| 6,645,666 B1 | 11/2003 | Moores, Jr. et al. |
| 6,949,309 B2 | 9/2005 | Moores, Jr. et al. |
| 6,967,464 B2 | 11/2005 | Heigl et al. |
| 7,014,945 B2 | 3/2006 | Moores, Jr. et al. |
| 7,056,616 B2 | 6/2006 | Moores, Jr. et al. |
| 7,238,443 B2 | 7/2007 | Sakakibara |
| 7,252,904 B2 | 8/2007 | Moores, Jr. et al. |
| 7,270,910 B2 | 9/2007 | Yahnker et al. |
| 7,326,490 B2 | 2/2008 | Moores, Jr. et al. |
| 7,372,237 B2 | 5/2008 | Bushong et al. |
| 7,382,945 B1 | 6/2008 | Sanders |
| 7,456,605 B2 | 11/2008 | Nakasho et al. |
| 7,508,171 B2 | 3/2009 | Carrier et al. |
| 7,557,542 B2 | 7/2009 | Bushong et al. |
| 7,572,547 B2 | 8/2009 | Sakakibara |
| 7,589,493 B2 | 9/2009 | Satsuma |
| 7,602,146 B2 | 10/2009 | Carrier et al. |
| 7,719,234 B2 | 5/2010 | Carrier et al. |
| 7,736,792 B2 | 6/2010 | Moores, Jr. et al. |
| 7,939,193 B2 | 5/2011 | Moores, Jr. et al. |
| RE42,468 E | 6/2011 | Heigl et al. |
| 7,993,772 B2 | 8/2011 | Sakakibara |
| 8,097,354 B2 | 1/2012 | Sakakibara |
| 8,426,051 B2 | 4/2013 | Sakakibara |
| 8,741,467 B2 | 6/2014 | Sakakibara |
| 9,225,184 B2 | 12/2015 | Rief |
| 9,273,697 B2 | 3/2016 | Cardo |
| 9,917,452 B2 | 3/2018 | Kishima et al. |
| 10,103,365 B2 | 10/2018 | Zhang et al. |
| 10,103,558 B2 | 10/2018 | Teng et al. |
| 10,547,186 B2 | 1/2020 | Namiki |
| 10,601,236 B2 | 3/2020 | Seidel et al. |
| 10,686,318 B2 * | 6/2020 | Taga ................. H02J 7/0013 |
| 2005/0073282 A1 | 4/2005 | Carrier et al. |
| 2006/0110656 A1 | 5/2006 | Moores et al. |
| 2006/0231239 A1 | 10/2006 | Katzenberger et al. |
| 2008/0003491 A1 | 1/2008 | Yahnker et al. |
| 2009/0146614 A1 | 6/2009 | Carrier et al. |
| 2009/0234532 A1 * | 9/2009 | Yoon ................. H01M 10/6563 701/29.5 |
| 2012/0327573 A1 | 12/2012 | Glauning |
| 2013/0207617 A1 * | 8/2013 | Houchin-Miller ...... B60L 50/66 429/71 |
| 2015/0188333 A1 | 7/2015 | Zhang et al. |
| 2017/0331302 A1 | 11/2017 | Namiki |
| 2019/0237826 A1 | 8/2019 | Ida et al. |
| 2019/0296280 A1 | 9/2019 | Stickel et al. |
| 2019/0372365 A1 | 12/2019 | Qin et al. |
| 2020/0280200 A1 | 9/2020 | Taga |
| 2021/0143499 A1 | 5/2021 | Sprague et al. |
| 2021/0167430 A1 | 6/2021 | Silha et al. |

FOREIGN PATENT DOCUMENTS

| | | |
|---|---|---|
| CN | 202905917 U | 4/2013 |
| CN | 103700899 A | 4/2014 |
| CN | 203774378 U | 8/2014 |
| CN | 205178582 U | 4/2016 |
| CN | 106941271 A | 7/2017 |
| CN | 104882935 B | 5/2018 |
| CN | 108173319 A | 6/2018 |
| CN | 209544558 U | 10/2019 |
| CN | 210092927 U | 2/2020 |
| CN | 108736096 B | 4/2020 |
| CN | 210327110 U | 4/2020 |
| CN | 111243202 A | 6/2020 |
| CN | 210866264 U | 6/2020 |
| CN | 211063374 U | 7/2020 |
| CN | 211127200 U | 7/2020 |
| CN | 211404562 U | 9/2020 |
| DE | 102004020147 B4 | 11/2007 |
| DE | 102017211205 A1 | 1/2019 |
| DE | 102017214600 A1 | 2/2019 |
| EP | 1475876 B1 | 1/2011 |
| EP | 3327888 A1 | 5/2018 |
| EP | 3531468 A1 | 8/2019 |
| EP | 3531469 A1 | 8/2019 |
| EP | 3389116 B1 | 7/2020 |
| EP | 3531470 B1 | 8/2020 |
| JP | H0648154 A | 2/1994 |
| WO | 2007072784 A1 | 6/2007 |
| WO | 2015075914 A1 | 5/2015 |
| WO | 2017208710 A1 | 12/2017 |
| WO | 2019112578 A1 | 6/2019 |
| WO | 2020130518 A1 | 6/2020 |
| WO | 2020175010 A1 | 9/2020 |

* cited by examiner

POWER TOOL SYSTEM

CROSS-REFERENCE TO RELATED APPLICATIONS

This application claims priority to U.S. Provisional Patent Application No. 63/219,408, filed Jul. 8, 2021, the entire contents of each of which are incorporated by reference herein.

BACKGROUND

The present utility model relates to a power tool system including a charger, a battery pack, and a power tool.

A typical battery charger includes a battery charging circuit that is connectable to a power source and to a rechargeable battery and that is operable to charge the battery. A typical power tool includes a battery pack mount portion that is connectable to and powered by the rechargeable battery.

SUMMARY

In one construction, the invention provides a charger including a housing that has a front wall, a rear wall, a top wall, a bottom wall, a first side wall, and a second side wall, an interface positioned in the front wall and configured to engage a battery pack, and an air conditioning assembly coupled within the housing adjacent the interface. The battery pack interface includes charging terminals positioned between a first rail and a second rail, a first groove positioned between the first rail and a wall of the housing, and a second groove positioned between the second rail and the wall of the housing. The interface is in communication with an interior of the housing. The air conditioning system is operable to suck an ambient air flow into the housing from outside the housing, reduce a temperature of the air flow to create a cooling air flow, and guide the cooling air flow to the battery pack interface.

In another construction, the invention provides a charger including a housing that has a front wall, a rear wall, a top wall, a bottom wall, a first side wall, and a second side wall, an interface positioned in the front wall and configured to engage a battery pack, a charger electronics configured to charge the battery pack when the battery pack is engaged with the charger, and an air conditioning assembly coupled within the housing adjacent the interface. The battery pack interface includes charging terminals positioned between a first rail and a second rail, a first groove positioned between the first rail and a wall of the housing, and a second groove positioned between the second rail and the wall of the housing. The interface is in communication with an interior of the housing. The air conditioning system is operable to suck an ambient air flow into the housing from outside the housing, reduce a temperature of the air flow to create a cooling air flow, and guide the cooling air flow to at least one of the battery pack interface and the charger electronics.

In another construction, the invention provides a power tool including a housing, a working element, power tool electronics configured to actuate a working element, an air conditioning assembly supported by the housing that is operable to remove heat from within the housing and generate cooling air flow, and a blower supported by the housing and configured to guide the cooling air flow to cool at least one of a surface of the housing and the power tool electronics.

DETAILED DESCRIPTION

Before any independent constructions of the utility model are explained in detail, it is to be understood that the utility model is not limited in its application to the details of construction and the arrangement of components set forth in the following description or illustrated in the following drawings. The utility model is capable of other independent constructions and of being practiced or of being carried out in various ways.

Use of "including" and "comprising" and variations thereof as used herein is meant to encompass the items listed thereafter and equivalents thereof as well as additional items. Use of "consisting of" and variations thereof as used herein is meant to encompass only the items listed thereafter and equivalents thereof.

Figure 1:
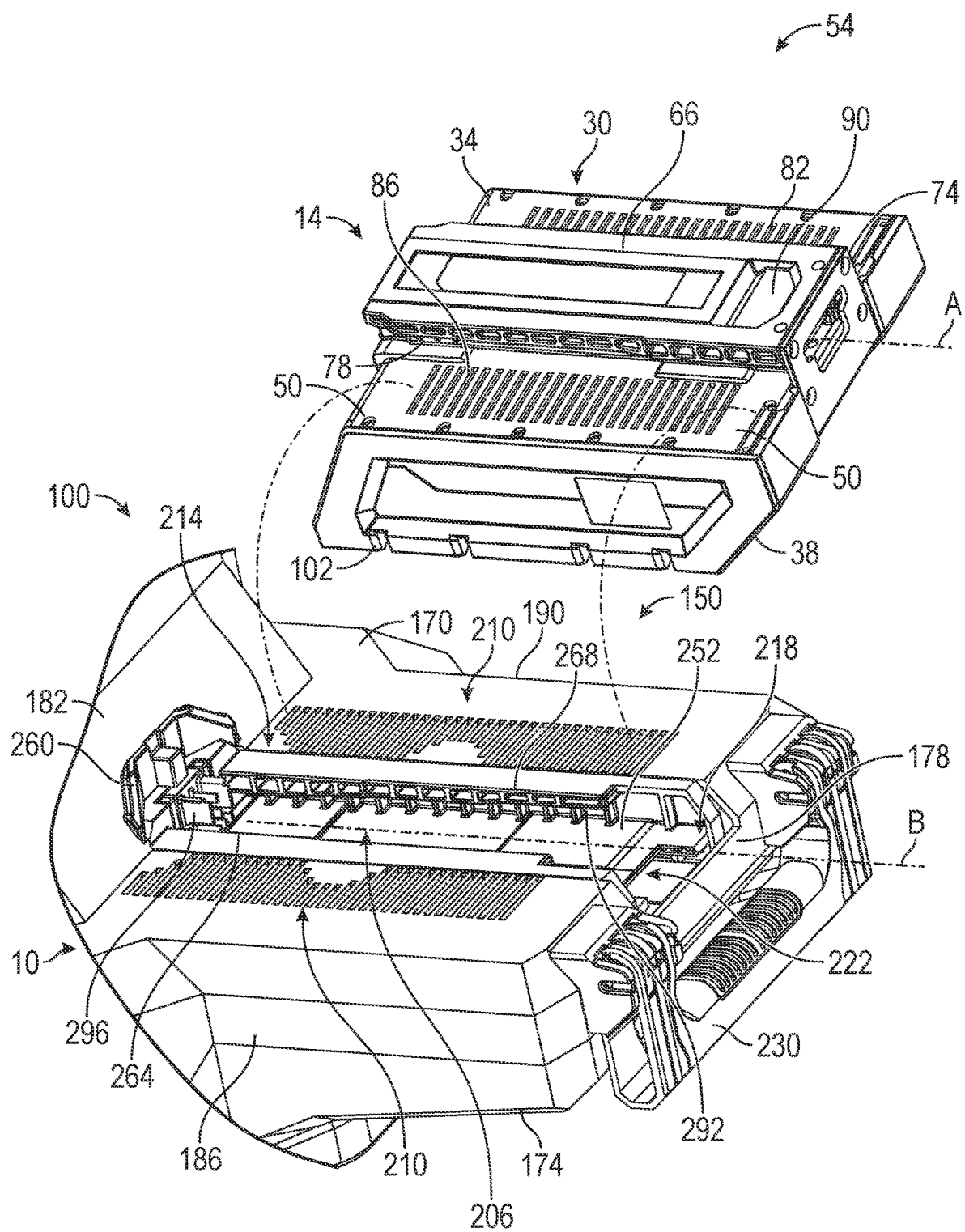
FIG. 1 is an exploded view of a battery charger according to one construction coupled to a complementary battery pack.
Figure 2A:
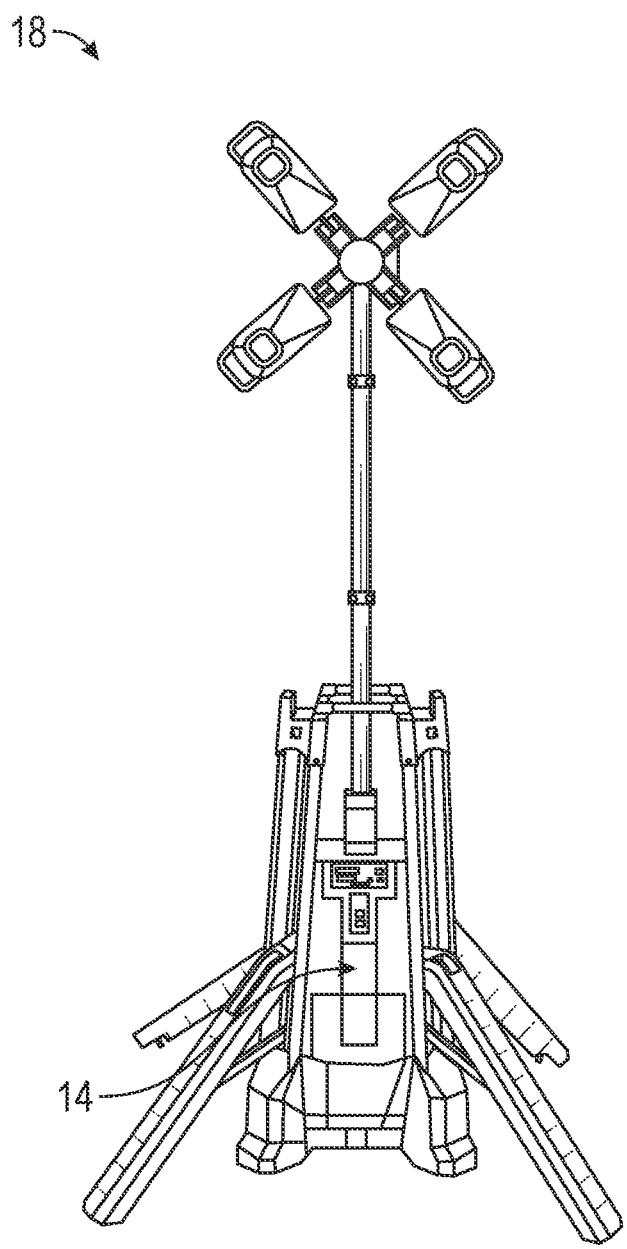
FIG. 2A is a perspective view of a power tool according to one construction coupled to the complementary battery pack of FIG. 1.
Figure 2B:
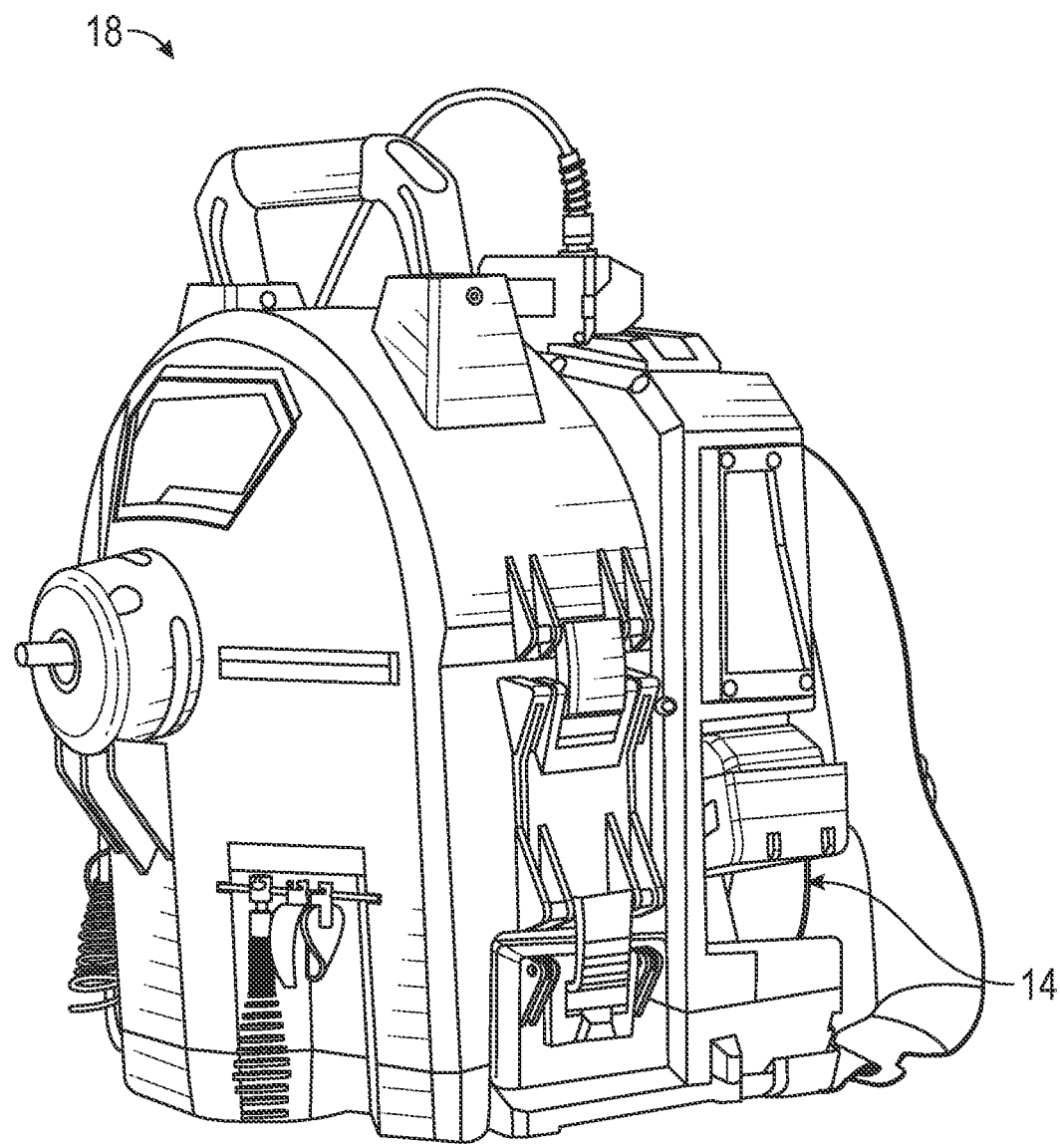
FIG. 2B is a perspective view of a power tool according to another construction coupled to the complementary battery pack of FIG. 1.
Figure 2C:
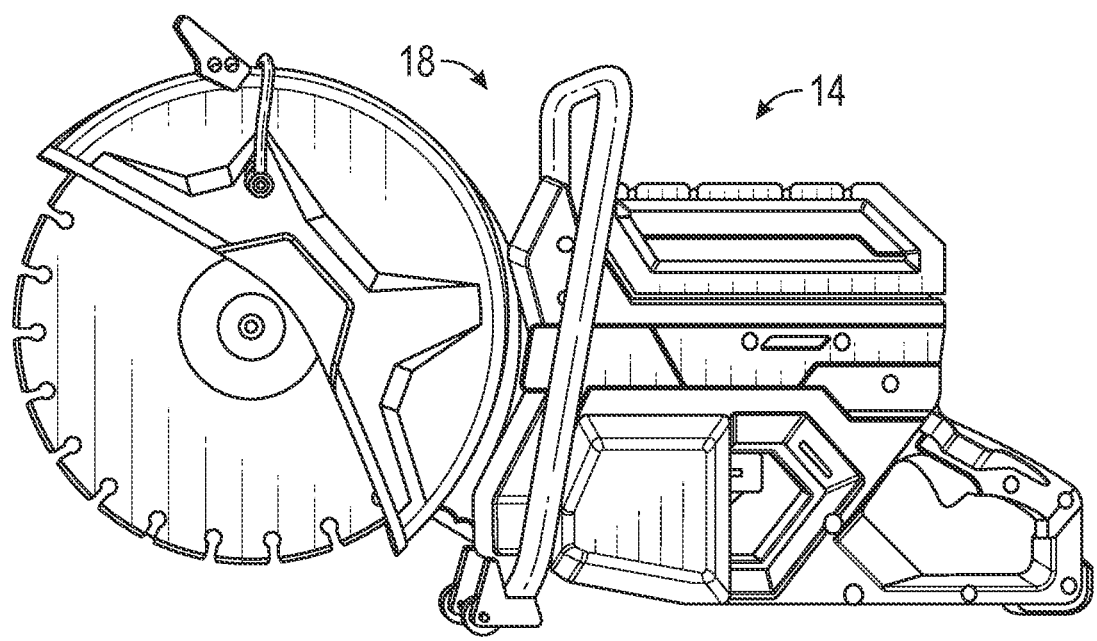
FIG. 2C is a perspective view of a power tool according to another construction coupled to the complementary battery pack of FIG. 1.
Figure 2D:
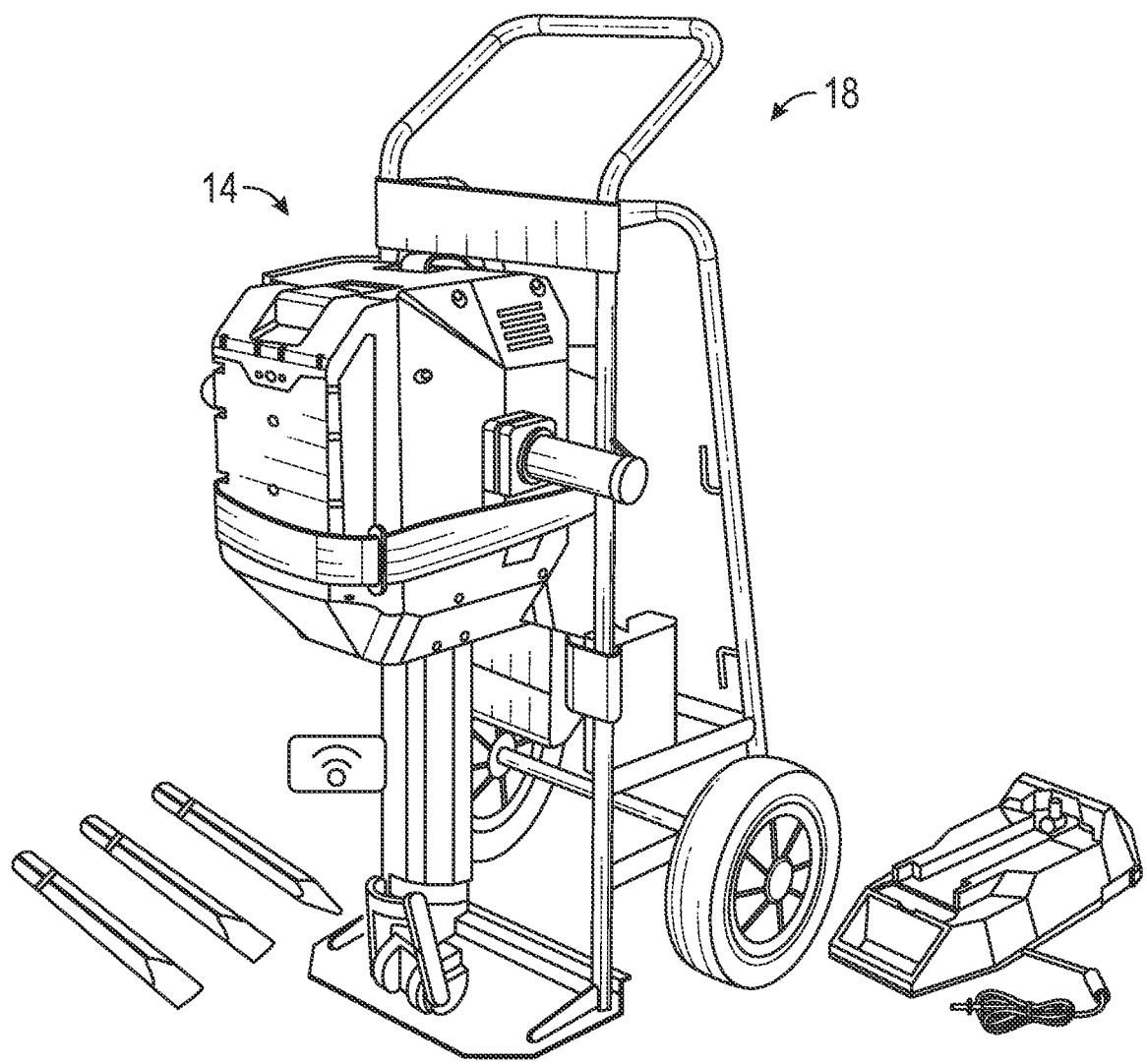
FIG. 2D is a perspective view of a power tool according to another construction coupled to the complementary battery pack of FIG. 1.

FIGS. 1-2D illustrates a power tool system including a battery charger 10, a battery pack 14, and power tool 18. The battery charger 10 is configured to removably couple to and to charge cells of the battery pack 14. The power tool 22 is configured to removably couple to and be powered by the battery pack 14. The power tool 22 may be any suitable power tool. As shown in FIGS. 2A-2D, the power tool 22 may be, for example, a site light (FIG. 2A), a drain cleaner (FIG. 2B), a saw (e.g., a concrete saw, FIG. 2C), or a breaker (e.g., a concreate breaker, FIG. 2D). In other constructions, the battery pack 14 may be couplable to and operable to power other motorized power tools (e.g., a cut-off saw, a miter saw, a table saw, a core drill, a sewer cleaner, an auger, a demolition hammer, a compactor, a vibrator, a compressor, a welder, a cable tugger, a pump, etc.), outdoor tools (e.g., a chain saw, a string trimmer, a hedge trimmer, a blower, a lawn mower, etc.), other motorized devices (e.g., vehicles, utility carts, a material handling cart, etc.), and non-motorized electrical devices (e.g., a power supply, an AC/DC adapter, a generator, etc.).

As shown in FIG. 1, the battery pack 14 may include a battery pack housing 30 including a longitudinal axis A, a first (e.g., top) portion 34, and a second (e.g., bottom) portion 38 that are coupled to the first portion 34. The housing 30 encloses a plurality of battery cells (not shown) that are secured within an interior of the housing. The housing 30 also encloses battery pack circuitry (not shown). The first portion 34 is symmetrical about the longitudinal axis A, engageable with the charger 18, and includes a wall 50 and a battery pack interface 54 that extends from the wall 50. The battery pack interface 54 includes a terminal block (not shown) with openings (not shown) extending therethrough that allow access to battery pack terminals (not shown) positioned within the housing 30. On opposite sides of the battery pack interface 54 are rails 66, 70 and grooves 74, 78 that are defined between the respective rail 66, 70 and the wall 50. A first plurality of vent holes 82 and a second plurality of vent holes 86 extend through the wall 50 and are in communication with the interior of the battery pack 14. The first plurality of vent holes 82 and the second plurality of vent holes 86 are positioned on opposite sides of the battery pack interface 54 are adjacent to the respective rails 66, 70 and grooves 74, 78. The plurality of vent holes 82, 86 are sequentially oriented parallel to the respective rails 66, 70. The battery pack 14 further includes a latch opening 90 for receiving the latch mechanism of a power tool (not shown). In other constructions, the battery pack 14 may include a latch mechanism that is couplable to the power tool. The second portion 38 includes a plurality of holes 102 that allow communication between the interior of the battery pack 14 and outside of the battery pack 14.

Figure 3:
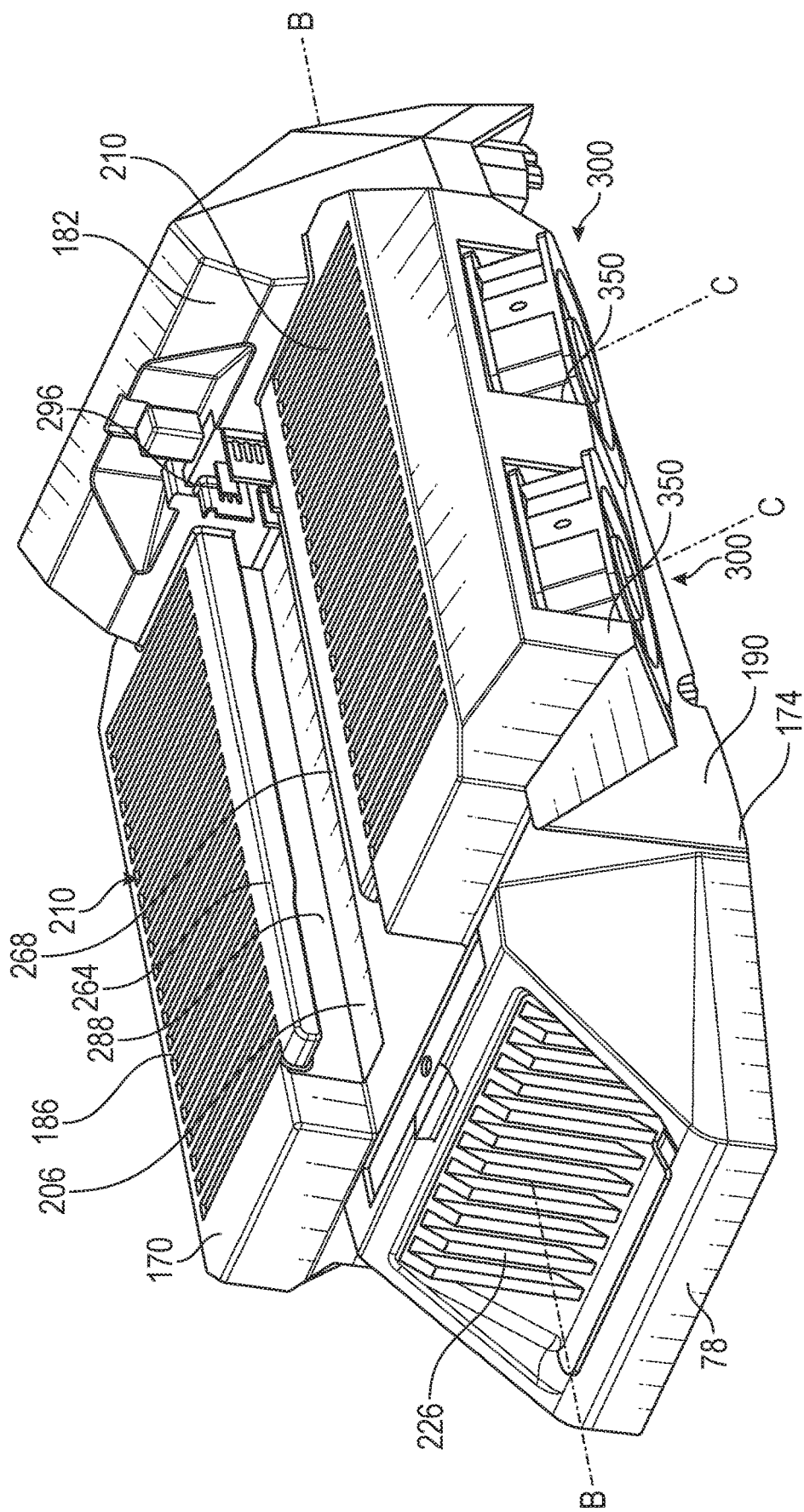
FIG. 3 is a perspective view of a battery charger according to another construction that is couplable to the complementary battery pack of FIG. 1.

Further with respect to FIGS. 1 and 3, the charger 18 includes charger housing 100. The charger housing 100 has a battery receiving portion 150, a first wall 170, a second wall 174, a third wall 178, a fourth wall 182, a fifth wall 186, and a sixth wall 190. In the illustrated construction the first wall 170 is the top wall and the second wall 174 is the bottom wall and therefore the first wall 170 and the second wall 174 are spaced apart from one another. Specifically, the first wall 170 and the second wall 174 are positioned opposite one another. The third wall 178 is the front wall and the fourth wall 182 is the rear wall and therefore the third and fourth walls 178, 182 are spaced apart from one another. Specifically, the third wall 178 and the fourth wall 182 are positioned opposite one another. The fifth and sixth walls 186, 190 couple the first wall 170, the second wall 174, third wall 178 and fourth wall 182. In the illustrated embodiment, the charger housing 100 is molded from a plastic material.

The first wall 170 includes an elongate opening 206 and a plurality of vent holes 210 extending therethrough. The elongate opening 206 has a closed end 214 adjacent the fourth wall 182 and an open end 218 adjacent the third wall 178. A charger interface 222 is positioned in the elongate opening 206, at least partially supported by the first wall 170, and configured to receive the battery pack interface 54. A first set of the plurality of vent holes 210 are positioned on one side of the elongate opening 206 and a second set of the plurality of vent holes 210 are positioned on an opposite side of the elongate opening 206. Other walls (e.g., the second wall 174, the third wall 178) may a plurality of vent holes 226 (FIG. 3) extending therethrough. A handle 230 extends from and is movable (e.g., pivotable) relative to the third wall 178.

The charger interface 222 has an insertion axis B (FIG. 21). Moreover, a terminal block 260 positioned within the battery pack receiving portion 150 adjacent the closed end 214. Charging terminals 296 extend from the terminal block 260. The charger interface 222 is at least partially defined by a wall 252 that is recessed relative to the 170, a first rail member 264, and a second rail member 268. The rail members 264, 268 are spaced apart and substantially parallel to one another. The insertion axis B is parallel to the rail members 264, 268. A first groove 288 (FIG. 3) is defined between the first rail member 264 and the recessed wall 252 and a second groove 292 (FIG. 1) is defined between the second rail member 268 and the recessed wall 252. A surface of each of the rail members 264, 268 is coextensive with an adjacent surface of the first wall 170 and the surfaces of the recessed wall 252.

Although not shown, charger electronics 298 are supported within the charger housing 100. The charger electronics 298 are operable to output a charging current to the battery pack 14 to charge the battery pack 14. The charger electronics 298 include, among other things, a printed circuit board (PCB) (not shown) and a charger microcontroller (not shown).

Figure 4A:
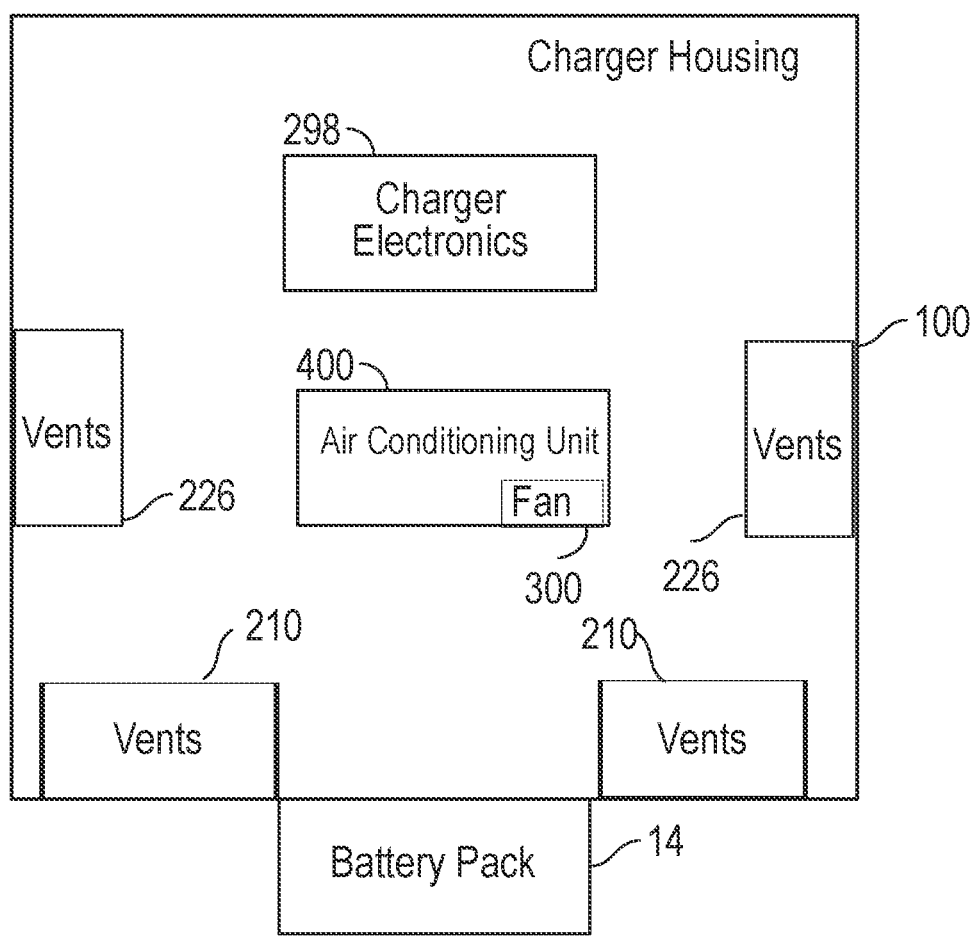
FIG. 4A is a schematic view of either the battery chargers of FIG. 1 or 3.

With respect to FIGS. 3 and 4A, in some constructions, the charger 100 may include one or more blowers 300. In the illustrated construction, the blowers 300 are supported within a designated duct 350 (e.g., channel or passage) of the housing 100. As shown in FIG. 3, each of the fans 300 has an axis of rotation C that is positioned at a non-parallel and non-perpendicular angle relative to the insertion axis B. In the illustrated construction the axes of rotation C of the fans 300 are oriented in parallel to one another, but in other or additional constructions, the axes of rotation C may be oriented in parallel or at a non-parallel angles relative to one another. The blower 300 is powered by a blower motor 300a (FIG. 4B, 4C) that is in electrical communication with the charger electronics 298. Each of the blowers is configured to guide ambient air from an outside of the charger 100 to either or both of the battery pack 10 and the charger electronics 298 to cool the same.

Figure 4B:
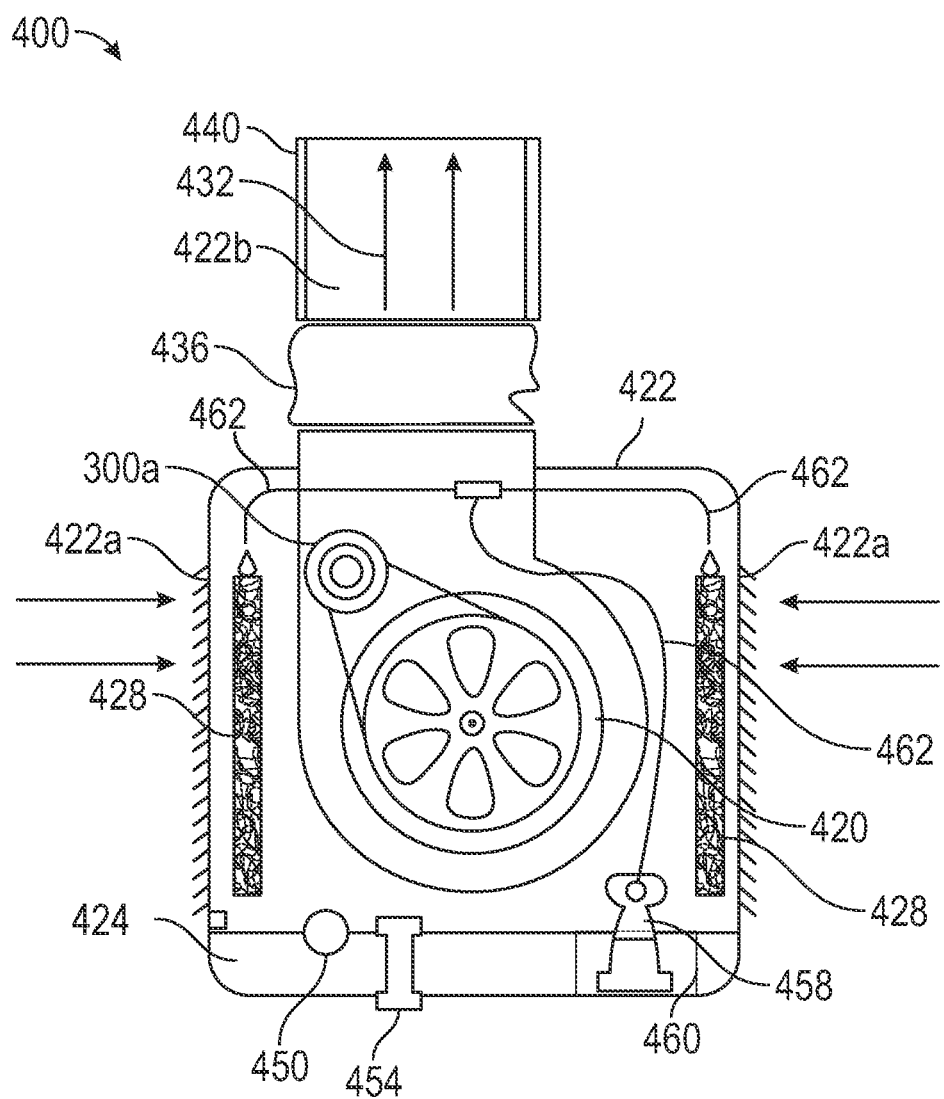
FIG. 4B is schematic view of an air conditioning assembly according to one construction that is usable with either of the battery chargers of FIG. 1 or 3.
Figure 4C:
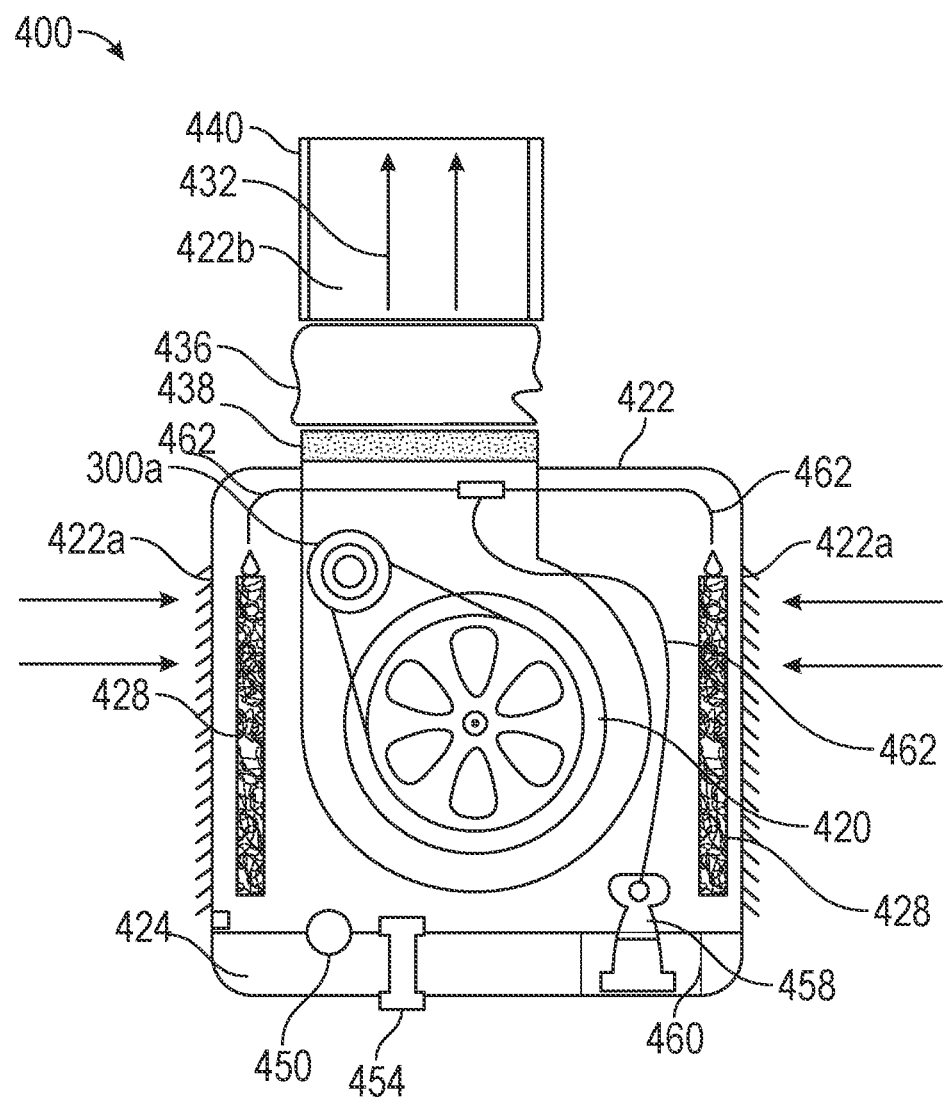
FIG. 4C is schematic view of an air conditioning assembly according to another construction that is usable with either of the battery chargers of FIG. 1 or 3.

As shown in FIGS. 4B and 4C, the charger housing 100 may additionally or alternatively support an air conditioning assembly 400. Accordingly, the air conditioning assembly 400 may be supported within one of the ducts 350 of the housing 100. Moreover, each of the air conditioning assemblies 400 may therefore be positioned at or adjacent to one or more of the vent holes 210 in the first wall 170. In some constructions, not shown, the charger housing 100 may include one or more air conditioning assemblies 400 that are positioned within the housing 100. That is, in some constructions, the one or more air conditioning assemblies 400 may be positioned between the one or more vent holes 210 in the first wall 170 and the one or more vent holes 226 in another wall. Accordingly, in these constructions, the one or more air conditioning assemblies 400 may be in communication with an interior of the charger housing 100 to cool the charger electronics 298, in addition to or alternatively to being in communication with an interior of the battery pack 14.

Further with respect to FIGS. 4B and 4C, each of the air conditioning systems 400 includes an evaporator and includes an air conditioning system housing 422, a coolant reservoir 424, and an evaporative member 428 in addition to a blower 300, which may be the same blower shown in FIG. 3 or an additional blower. The air conditioning system housing 422 may enclose the blower 300 and the evaporative member 428. In some constructions, the air conditioning system housing 422 may be omitted.

The air conditioning system housing 422 includes an inlet 422a and an outlet 422b, which may be positioned appropriately to guide a cooling airflow 432 (e.g., a chilled and humidified air flow (FIG. 4B), a chilled and dry airflow (FIG. 4C), or a conditioned air flow) to an element to be cooled (e.g., the battery pack 14 or all or a portion of the charger electronics 298). In the illustrated construction, there is a first inlet 422a on a first side of the housing 422 and a second inlet 422a on a second opposite side of the housing 422. The inlet 422a may be in communication with an exterior of the charger 10 via one or more vents 226 or the duct 350, for example. In the constructions in which the air conditioning assemblies 400 are positioned to cool the battery pack 14, the outlet 422b may be positioned adjacent to one or more of the plurality of vents 210. Additionally or alternatively, in the constructions in which the air conditioning assemblies 400 are positioned to cool the charger electronics 298, the outlet 422b may be positioned adjacent to or in fluid communication with an area surrounding the charger electronics 298. In some constructions, the outlet 422b may include a vibration absorber or dampener 436. The vibration absorber or dampener 436 may isolate the vibration of the blower/fan unit 420 from the outlet ducts 350, 422a. In some constructions, the outlet 422b may include moisture remover 438 (e.g. desiccant filter). That is, in some constructions, the air conditioning assembly 400 further includes the moisture remover downstream of the evaporative member 428. Without the moisture remover 438, the cooling airflow is chilled and humid airflow. With the moisture remove 438, the cooling airflow is chilled and dry airflow. Moreover, in some constructions, the outlet 422b may include an outer layer 440 that is constructed from an insulative material.

The coolant reservoir 424 may be positioned inside or outside of the charger housing 100. The coolant reservoir 424 may be directly or indirectly coupled to the air conditioning housing 422. The coolant reservoir 424 may enclose any suitable fluid or coolant, such as, but not limited to, water or ice. The coolant reservoir 424 may include a valve 450, an overflow mechanism 454 (e.g., an overflow tube), and a coolant distribution member. The overflow mechanism 454 may maintain the water inside the coolant reservoir 424 at a fixed level. While the water evaporates, the water level drops and a float valve 450, for instance, may open. The open valve 450 then allows more water to enter the coolant reservoir 424. If too much water enters the coolant reservoir 424, excess water will drain out through the overflow mechanism 454.

The evaporative member 428 is in communication with an exterior of the charger housing 100. The evaporative member 428 is positioned between the coolant reservoir 424 and the blower 300. The evaporative member(s) 428 may be wood wool evaporative pads, a sponge, a nano-absorbent material, or any other suitable material.

With respect to FIGS. 4B and 4C, in some constructions, the coolant distribution member of the air conditioning system 400 is an active coolant distribution member including a pump 458, which may or may not include a screen or filter 460, and a coolant distribution line 462. The coolant in the coolant reservoir 422 is actively delivered to the evaporative member 428 via the pump 458 and the coolant distribution line 462. In particular, the coolant distribution line 462 may be coupled between the evaporative member 428 and the pump 458.

Further with respect to FIGS. 4B and 4C, a first evaporative member 428 is positioned adjacent to one of the inlets 422a and on one side of the blower 300, and a second evaporative member 428 is positioned adjacent the other of the inlets 422a and on another, opposite side of the blower 300. In the illustrated construction, the coolant distribution line includes an outlet line 462 coupled to and in fluid communication with the pump 458, a first inlet line 462 coupled to and in fluid communication with the first evaporative member 428, and a second inlet line 462 coupled to and in fluid communication with the second evaporative member 428.

Figure 5:
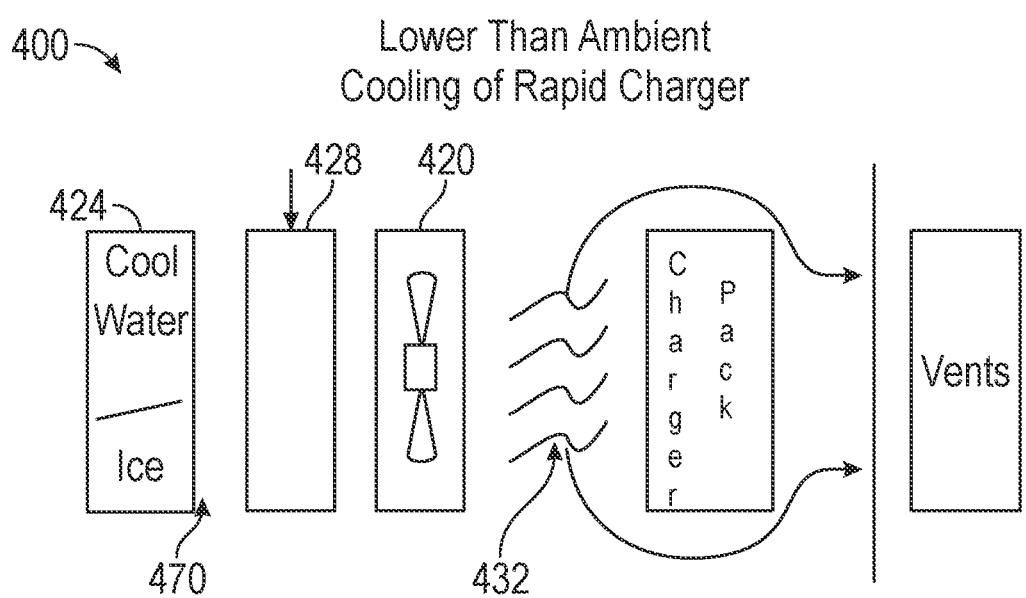
FIG. 5 is schematic view of an air conditioning assembly according to another construction that is suitable for use with either of the battery chargers of FIG. 1 or 3.
Figure 6:
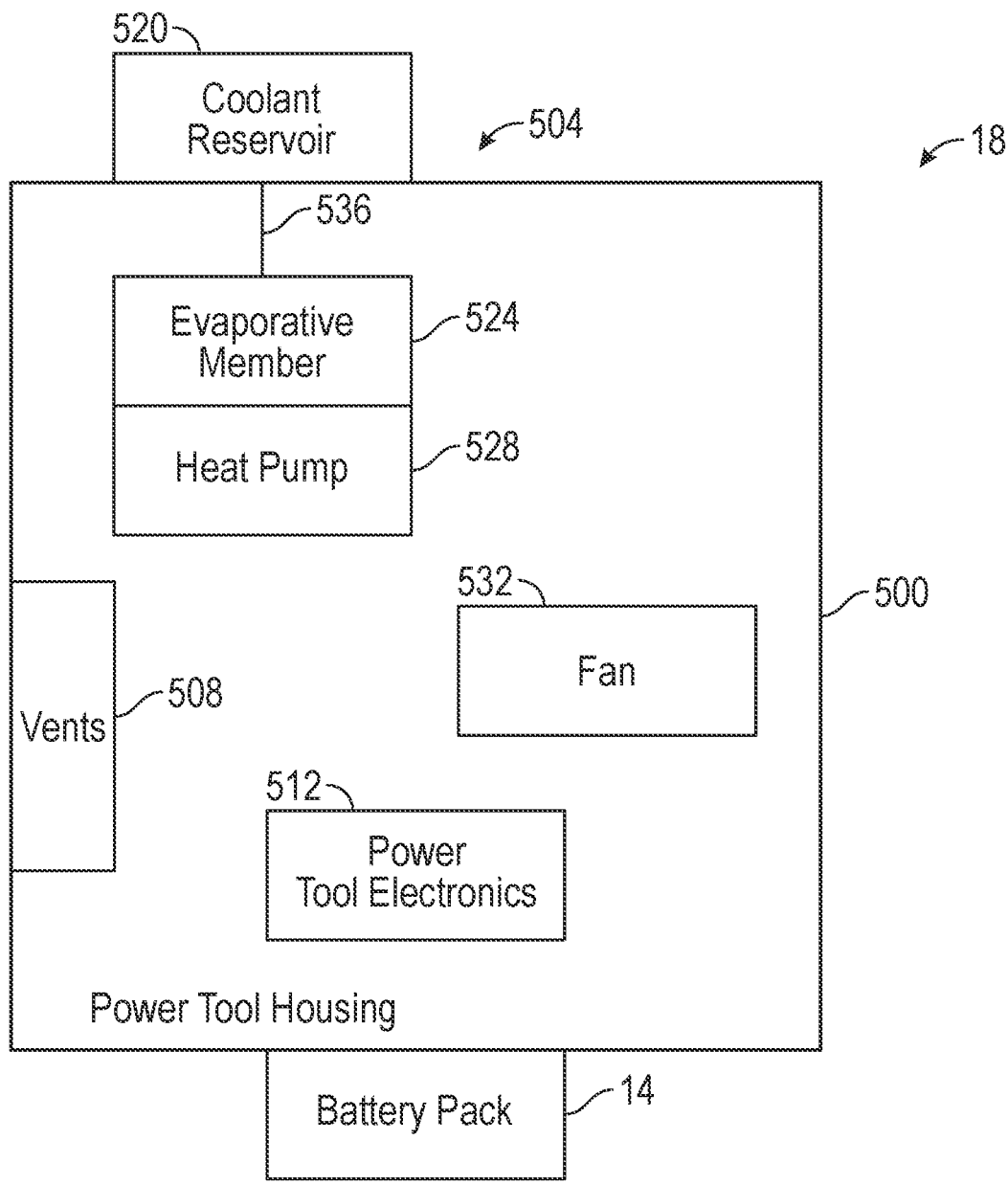
FIG. 6 is a schematic view of the power tool of FIGS. 2A-2D including an air conditioning assembly according to one construction.

With respect to FIG. 5, the coolant distribution member of the air conditioning system 400 is a passive coolant distribution member including a semi-porous barrier 470 that is in fluid communication with the coolant contained within the coolant reservoir 424. That is, the semi-porous barrier 470 is positioned between and allows passive fluid communication with the coolant reservoir 424 and the evaporative member 428. In some constructions, although not shown, a coolant distribution line may extend between the semi-porous barrier 470 and the evaporative member 428.

As noted above, each of the air conditioning assemblies 400 generates the cooling airflow 432. As shown, ambient air moves from outside of the charger 18 via the one or more inlets 226, 350 through the charger housing 100 and one of the air conditioning assemblies 400, which cools the ambient air to the generate cooling airflow 432. Then the cooling airflow 432 is distributed to the element to be cooled (e.g., the battery pack 14 or the charger electronics 298 or both). Specifically, the blower 300 of each of the air conditioning assemblies 400 is operable to draw ambient air into the charger housing 100 through the respective evaporative member 428. As air moves through the evaporative member 428, the coolant evaporates using the heat from the ambient air to chill and humify the air thereby creating the cooling air flow 432. The blower 300 then ejects the cooling airflow 432 to the element to be cooled. In the illustrated construction, the cooling air flow 432 generated by each of the air conditioning assemblies 400 is guided to the battery pack 14 via the one or more of the plurality of vent holes 210 in the first wall 170 and the respective plurality of vent holes 82, 86 in the battery pack 14 to cool the battery pack 14. In some constructions, the cooling air flow 432 generated by one of the air conditioning assemblies 400 is guided through the charger housing 100 to cool the charger electronics 298 before exiting the charger housing 100. In some constructions, the cooling air flow 432 generated by one of the air conditioning assemblies 400 is guided to the battery pack 14 and through the charger housing 100 to cool the charger electronics 298 before exiting the charger housing 100.

Although the air conditioning assemblies 400 disclosed herein are evaporators or evaporative air conditioning assemblies, the air conditioning assemblies may be configured as condensers (e.g., condensing air conditioning assemblies) or radiators in other constructions. In still other embodiments, the air conditioning assemblies 400 may include a refrigeration system including an evaporator, a condenser, a radiator, or a combination of these.

As shown in FIGS. 6-8B, the power tool 18 includes a housing 500 and an air conditioning assembly 504 that is coupled to the housing 500, which may include vents or vent holes 508. The vent holes 508 allow fluid communication between an outside of the power tool housing 500 and an inside of the power tool housing 500. The power tool housing 500 also encloses power tool electronics 512, which are in communication with the battery pack 14 and working members (e.g., LEDs, motors, drive mechanisms, etc.) of the power tool 18. The power tool electronics are configured to actuate the working members via power from the battery pack 14. The air conditioning system 504 includes is a heat pump system in the illustrated construction. Moreover, the air conditioning system includes a coolant reservoir 520, an evaporative member 524, a heat pump 528, and a blower 532 (e.g., fan).

Figure 7:
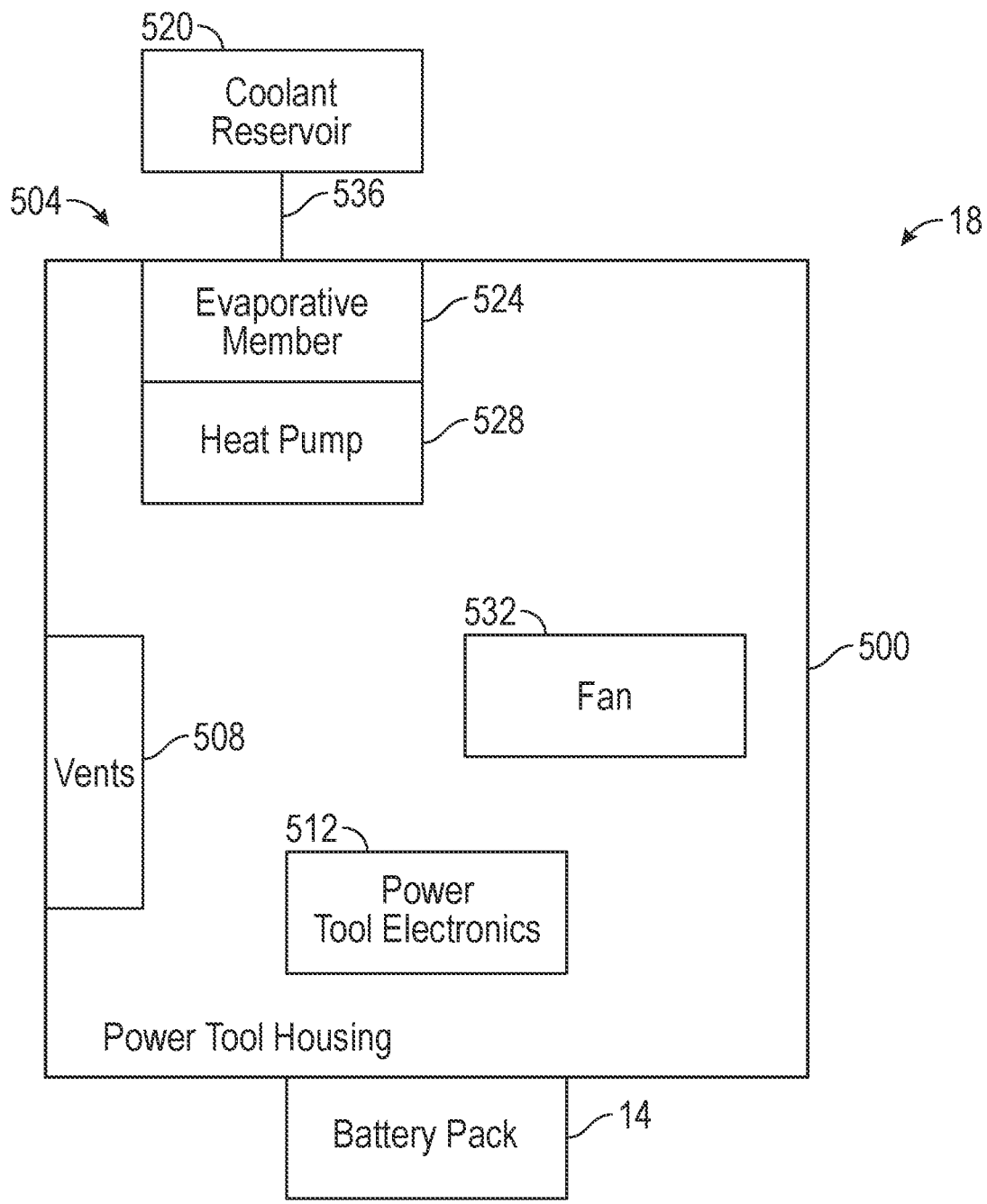
FIG. 7 is a schematic view of the power tool of FIGS. 2A-2D including an air conditioning assembly according to another construction.
Figure 8A:
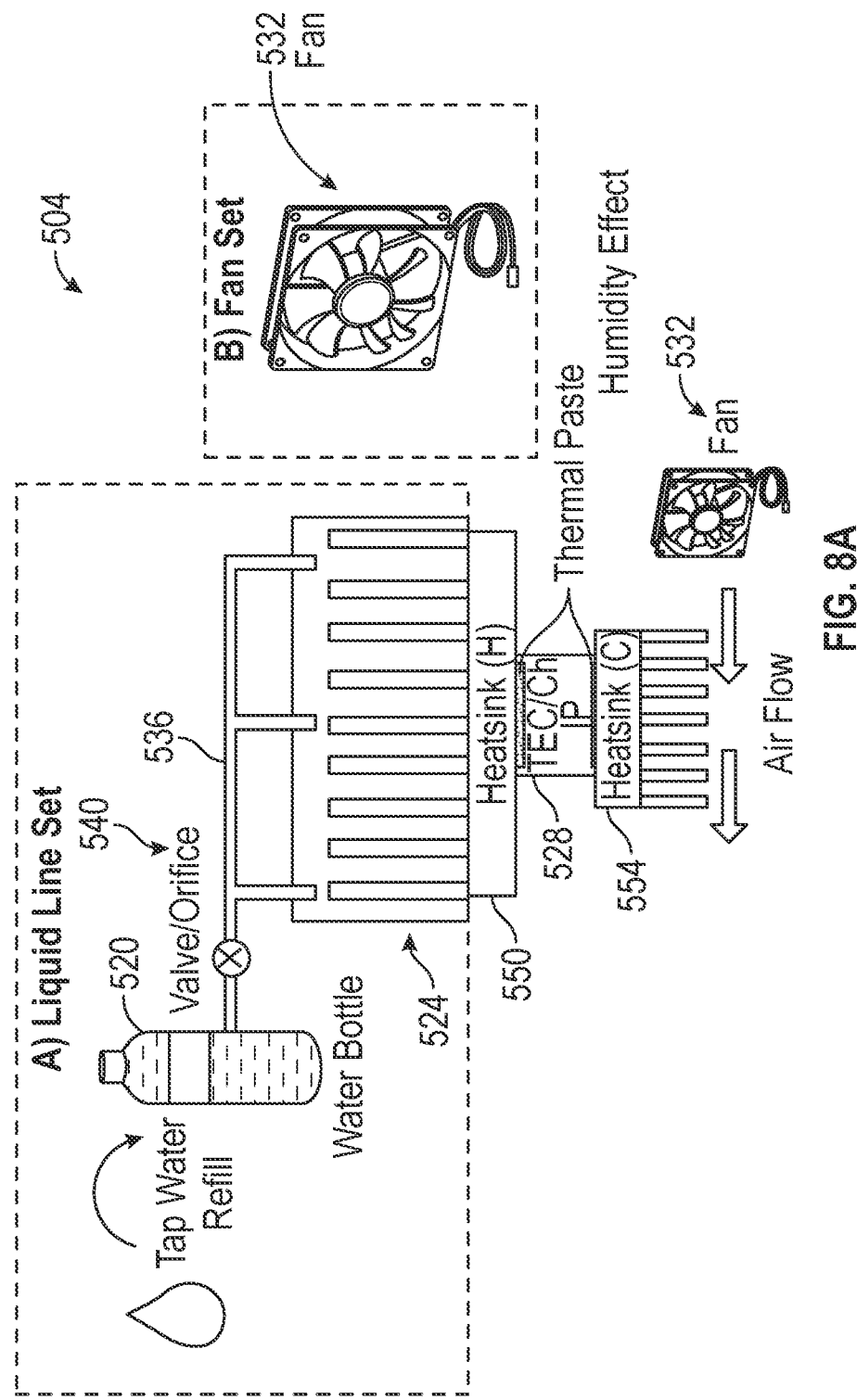
FIG. 8A is a schematic of either of the air conditioning assemblies of FIG. 6 or 7.
Figure 8B:
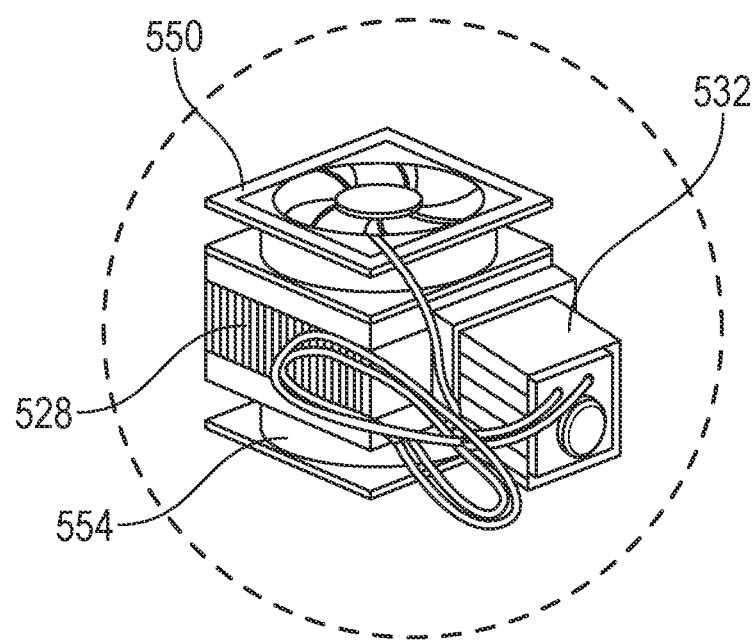
FIG. 8B is an assembled view of a portion of the air conditioning assemblies of FIGS. 6 and 7.

The coolant reservoir 520 houses a coolant or fluid, such as (but not limited to) water or ice, and is positioned outside of the power tool housing 500, such that is refillable. The coolant reservoir 520 may be coupled directly to an exterior surface of the power tool housing 500 (FIG. 6) or the coolant reservoir may be spaced apart from the power tool housing 500 (FIG. 7). Regardless, the coolant reservoir 520 is in fluid communication with the evaporative member via a coolant distribution member 536. The evaporative member 524, the heat pump 528, and the blower 532 are positioned within the power tool housing 500. In some constructions, the evaporative member 524, the heat pump 528, and the blower 532 may be positioned within an air conditioning system housing (not shown). In the illustrated constructions, the coolant distribution member 536 includes one or more coolant distribution lines, for example. A valve 540 is positioned along the one or more coolant distribution lines 536. In the illustrated constructions, the coolant reservoir 520 is positioned above the power tool housing 500 and the evaporative member 524 such that the coolant is passively metered, via the valve 540, to the evaporative member 524. In other constructions, the coolant distribution member 536 may be another passive-type coolant distribution member (such as the semi-porous barrier, discussed above with respect to the charger constructions) or an active-type coolant distribution member (such as a pump, discussed above with respect to the charger constructions).

The evaporative member 524 is positioned between the coolant reservoir 524 and the heat pump 528. The evaporative member 524 may be a sponge, wood wool evaporative pads, a nano-absorbent material, or any other suitable material. The heat pump 528 is in communication with the evaporative member 524 via a first heat sink 550 (e.g., a hot heat sink) and is in communication with air within the power tool housing 500 via a second heat sink 554 (e.g., a cold heat sink). In the illustrated constructions, the heat pump 528 is a TEC module and is coupled to the first and second heat sinks 550, 554 via an adhesive (e.g., a thermal paste). In other constructions, the heat pump 528 may have other suitable constructions and may be coupled to the heat sinks 550, 554 in other suitable ways. The heat pump 528 pumps heat out of the air within the power tool housing 500 from the second heat sink 554 to the first heat sink 550 to generate a cooling airflow (e.g., a chilled and humidified air flow, a conditioned air flow) within the power tool housing 500. That is, the first heat sink 550 continuously evaporates coolant to dissipate the heat out of the power tool housing 500, and the second heat sink 554 cools the air around it to generate the cooling airflow. The blower 532 is positioned adjacent the second heat sink and guides the cooling airflow to heat sources of the power tool 18, such as the battery pack 14, the power tool electronics 512, the material of the power tool housing 500 to cool the skin of the user, through the vents 508 to cool the skin of the user, or a combination of these.

Although the air conditioning assembly 504 disclosed herein is a heat pump 528, the air conditioning assembly may be configured as an evaporator (similar to the constructions used above in the charger 10), as a condenser (e.g., condensing air conditioning assembly) or a radiator in other constructions. In still other embodiments, the air conditioning assemblies 400 may include a refrigeration system including an evaporator, a condenser, a radiator, or a combination of these.

Although the disclosure has been described with reference to certain preferred aspects, variations and modifications exist within the scope and spirit of one or more independent aspects of the disclosure as described. Various features and advantages of the disclosure are set forth in the following claims.

What is claimed is:

1. A charger comprising:
a housing;
a battery pack interface defined in the housing and configured to engage a battery pack, the battery pack interface including
a first rail,
a second rail spaced apart from the first rail,
charging terminals positioned between the first rail and the second rail, and
an opening defined in the housing, the opening in fluid communication with an interior of the housing; and
an air conditioning assembly coupled within the housing;
the air conditioning assembly including
an evaporative member configured to evaporate coolant to ambient air, thereby humidifying the ambient air, and
a blower operable to move the ambient air into the housing from outside the housing, through the evaporative member, and to the opening of the battery pack interface.

2. The charger of claim 1, wherein the air conditioning assembly further includes
a coolant reservoir that houses the coolant, the coolant reservoir in fluid communication with the evaporative member.

3. The charger of claim 2, wherein the coolant reservoir is in fluid communication with the evaporative member via a coolant distribution member.

4. The charger of claim 3, wherein the coolant distribution member is an active coolant distribution member including
a pump in fluid communication with the coolant reservoir, and
a coolant distribution line coupled between the pump and the evaporative member.

5. The charger of claim 3, wherein the coolant distribution member is a passive coolant distribution member including a semi-porous barrier in fluid communication with the coolant reservoir and the evaporative member.

6. The charger of claim 2, wherein the air conditioning assembly further comprises a desiccant filter positioned downstream of the evaporative member, the desiccant filter configured to remove moisture from the ambient air.

7. The charger of claim 1, wherein
the opening defined in the housing is one of a plurality of first vents defined in a wall of the housing having the battery pack interface, and the housing further includes a plurality of second vents defined in a wall of the housing other than the wall having the battery pack interface.

8. A charger comprising:
a housing;
a battery pack interface defined in the housing and configured to engage a battery pack, the battery pack interface including
a first rail,
a second rail spaced apart from the first rail, and
charging terminals positioned between the first rail and the second rail,
charger electronics disposed in the housing, the charger electronics configured to supply electricity to the charging terminals to charge the battery pack; and
an air conditioning assembly coupled within the housing; the air conditioning assembly including
an evaporative member configured to evaporate coolant to ambient air, thereby humidifying the ambient air, and
a blower operable to move the ambient air into the housing from outside the housing, through the evaporative member, and over the charger electronics.

9. The charger of claim 8, wherein the air conditioning assembly further includes
a coolant reservoir that houses the coolant, the coolant reservoir in fluid communication with the evaporative member.

10. The charger of claim 9, wherein the coolant reservoir is in fluid communication with the evaporative member via a coolant distribution member.

11. The charger of claim 10, wherein the coolant distribution member is an active coolant distribution member including
a pump in fluid communication with the coolant reservoir, and
a coolant distribution line coupled between the pump and the evaporative member.

12. The charger of claim 9, wherein the air conditioning assembly further comprises a desiccant filter positioned downstream of the evaporative member, the desiccant filter configured to remove moisture from the ambient air.

13. A power tool comprising:
a housing;
a working element;
power tool electronics configured to actuate the working element;
an air conditioning assembly supported by the housing and operable to remove heat from within the housing and generate a cooling air flow, the air conditioning assembly including
a coolant reservoir that houses a coolant,
an evaporative member in fluid communication with the coolant reservoir, the evaporative member configured to evaporate the coolant to ambient air,
a first heat sink in thermal communication with the evaporative member, such that the first heat sink is cooled by the evaporative member,
a heat pump in thermal communication with the first heat sink, the heat pump warming the first heat sink,
a second heat sink in thermal communication with the heat pump, the second heat sink cooled by the heat pump,
a blower configured to move air over the second heat sink, thereby creating the cooling air flow to cool a surface of the housing and/or the power tool electronics.

14. The power tool of claim 13, wherein the blower is positioned adjacent the second heat sink.

15. The charger of claim 10, wherein the coolant distribution member is a passive coolant distribution member including a semi-porous barrier in fluid communication with the coolant reservoir and the evaporative member.

* * * * *